United States Patent [19]

Rossi et al.

[11] Patent Number: 4,888,473

[45] Date of Patent: Dec. 19, 1989

[54] WAFER DISK LOCATION MONITORING SYSTEM AND TAGGED PROCESS CARRIERS FOR USE THEREWITH

[75] Inventors: Alexander N. Rossi, Pleasanton; Mario N. Sancen, Antioch, both of Calif.

[73] Assignee: Fluoroware, Inc., Chaska, Minn.

[21] Appl. No.: 346,915

[22] Filed: May 3, 1989

Related U.S. Application Data

[63] Continuation-in-part of Ser. No. 61,935, Jun. 11, 1987, Pat. No. 4,827,110.

[51] Int. Cl.$^4$ .............................................. G06F 15/46
[52] U.S. Cl. .................................... 235/376; 235/380
[58] Field of Search ............................... 235/376, 380

[56] References Cited

U.S. PATENT DOCUMENTS 4,570,058  2/1986  Havassy .............................. 235/479

Primary Examiner—Harold I. Pitts
Attorney, Agent, or Firm—Faegre & Benson

[57] ABSTRACT

A method and system for monitoring the process of a plurality of batches or semiconductor wafers or memory disks through a series of process operations and process carriers for use therein. Each batch is placed in a carrier in which it is transported to the locations where the processing operations are performed. Each carrier is provided with a transponder tag coded to be responsive to within reading range of a reader unit which transmits a radio frequency signal to the transponder tag and reads and decodes a phase modulated signal returned by the transponder tag to uniquely identify the carrier that is positioned within the range of the reader unit. Further control apparatus receives information from the reader units to permit the monitoring process of semiconductor wafer or memory disk batches through multiple processing operations. The carriers are specially designed to protect the transponder tag from the effects of the harsh chemical environments to which the carriers and disks are normally exposed during processing operations. A separate encapsulated transponder tag is also provided for attachment to existing carriers, so that they may be tracked by this monitoring system.

36 Claims, 4 Drawing Sheets

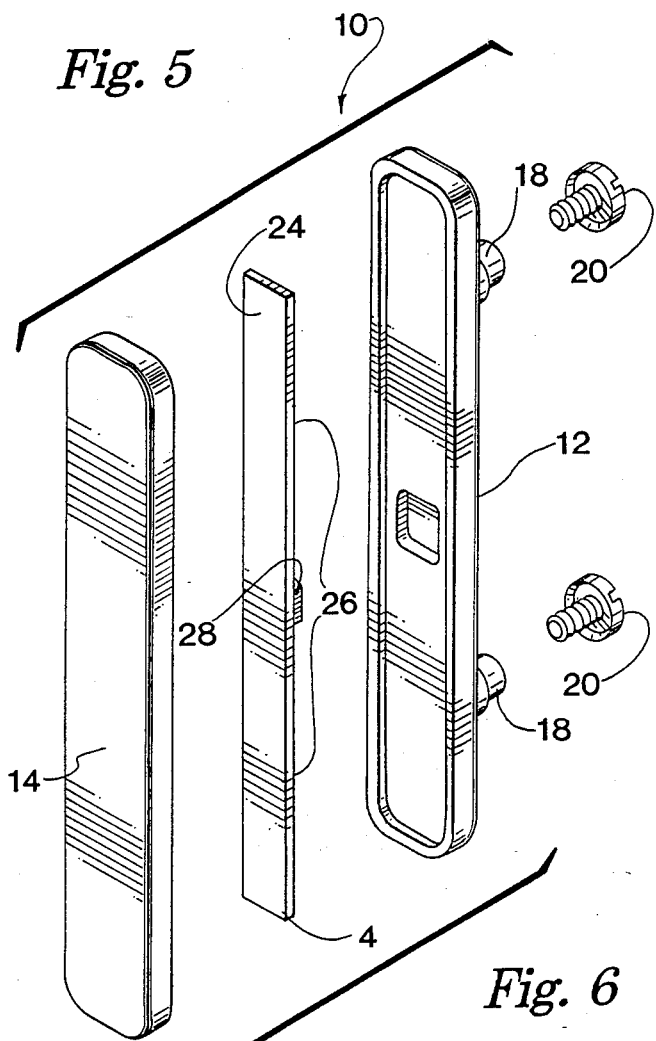
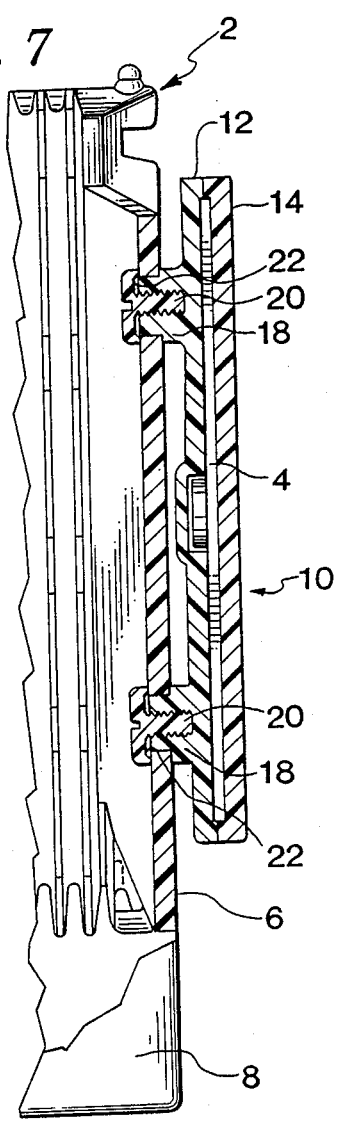
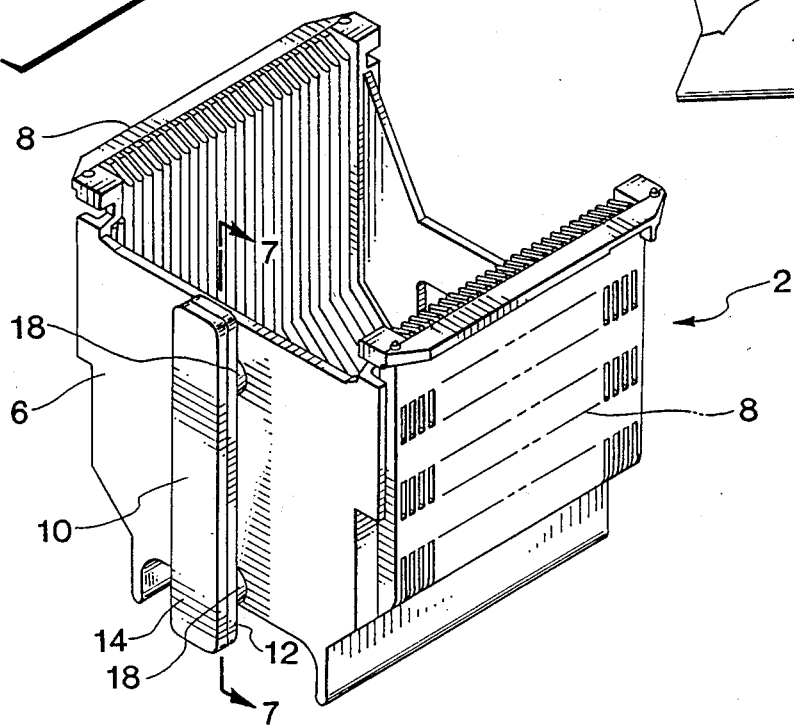

WAFER DISK LOCATION MONITORING SYSTEM AND TAGGED PROCESS CARRIERS FOR USE THEREWITH

This application is a continuation-in-part of co-pending application Ser. No. 07/061,935, filed June 11, 1987, now U.S. Pat. No. 4,827,110 issued May 2, 1989.

BACKGROUND OF THE INVENTION

1. Field of the Invention

This invention relates to a system for monitoring the progress of a plurality of batches of semiconductor wafers or memory disks through a multiplicity of processing operations at various locations within and between plant facilities. It also relates to process carriers for use in such a system, such as the Method and Apparatus for Monitoring the Location of Wafer Disks disclosed and described in co-pending application Ser. No. 07/061,935, filed June 11, 1987, now U.S. Pat. No. 4,827,110, issued May 2, 1989.

2. Description of Related Information

In the semiconductor manufacturing industry, semiconductor wafers are moved through a manufacturing plant to a number of different locations where they are etched, cleaned, processed using photolithography operations, tested and subjected to various other manufacturing, testing and processing operations. Similarly, memory disks are also moved in process carriers through a sequence of manufacturing operations in and between various manufacturing facilities.

It is common in the industry to handle wafers or memory disks in batches within carriers specifically designed for the purpose of supporting the wafers or memory disks in the proper position for the manufacturing and processing machinery, which may either process the disks or wafers while they remain in the carriers or remove them for a processing operation and then return them to the carrier. A batch is defined and used hereinafter to mean one or more (up to the capacity of the carrier) of the semiconductor wafers or memory disks.

In a manufacturing plant, it is desirable to track the progress of a batch of wafers or memory disks through the manufacturing process. Heretofore, this has been done on a manual basis, either by generating paper records to track the progress of particular batches through the various manufacturing and processing operations or by some semi-automated system such as manual keyboard entry.

Although methods of identifying objects using radio frequency interrogation of transponder ttag structures have existed for the past twenty years, the application of those techniques to monitoring the progress of batches of semiconductor wafers or memory disks through processing and manufacturing operations has only recently been successfully developed, as described in our earlier filed co-pending application Ser. No. 07/061,935, filed June 11, 1987. The present application describes process carriers having an transponder tag attached thereto for use in such a tracking and identification system. The transponder tag may be directly affixed to the surface of the carrier, preferably under a protective cover, or the tag may be encapsulated in a protective capsule and the capsule attached to the surface of the carrier, preferably in a removable manner. The attachment of the transponder tag to the carrier is designed to protect the transponder tag from the deleterious effects of exposure to rigorous processing chemicals. This invention also provides a separate encapsulated transponder tag in such a protective capsule, so that existing carriers may be modified or retrofitted with the separate encapsulated transponder tag for use in the present location monitoring system.

Summary of the Invention

The present invention provides a system for monitoring the progress of a plurality of batches of semiconductor wafers or memory disks through a multiplicity of processing operations at various locations within and between plant facilities, as described in our earlier co-pending application Ser. No. 07/061,935, filed June 11, 1987. Transponder tagged process carriers encoded for interrogation for use in such systems are also provided.

The system of the present invention includes inserting each of the batches of wafers or memory disks in a process carrier constructed and arranged for supporting the wafers or disks in parallel, axially arranged, spaced arrays. The carrier is adapted to permit the carrying out of processing operations at various locations within the plant without removal of the batch of semiconductor wafers or memory disks from the carrier. Each carrier has attached thereto a transponder tag, coded to uniquely identify the carrier and a batch of wafers or disks contained therein. To protect the transponder tag from the rigors of the harsh chemical environments to which the disks and their carriers are exposed, the tag may be affixed to the surface of the carrier under a protective cover or the transponder tag may be encapsulated in a protective capsule and attached to the surface of the carrier. Protection of the transponder tag by encapsulation has been found to provide the greatest level of protection from rigorous chemicals. Preferably, the encapsulated tag is removably attached to the carrier, so that the encapsulated tag may be removed from a carrier whose useful life has expired from chemical exposure and be attached to a new carrier. The encapsulated tag may be attached to any surface of the carrier. Existing carriers can be modified or retrofitted by having attached thereto an encapsulated transponder tag. Any method of securely attaching the encapsulated tag to the surface of the carrier permanently or removably may be used, as for example, fusion bonding, screw attachment or snap fit attachment.

Preferably, the encapsulated tag is attached vertically to an end wall of the carrier with the plane of the tag parallel to the plane of the disks within the carrier. Exemplary of typical processing solutions with which the transponder tagged carriers of this invention may be treated for prolonged or replicate procedures without deterious effect on the transponder tag itself are hydrofluoric acid, hydrochloric acid, nitric acid, aluminum etch, aqua regia, piranha, RCA clean, sodium hydroxide and hydrogen peroxide.

The proximity of each carrier to various locations within the processing facility is detected by a multiplicity of limited range reader units each of which is positioned at one of the various locations and is constructed and arranged for determining the unique identification of any carrier within its detection range. Carrier identification information from the reader units is stored and updated to monitor the progress of batches through processing operations.

BRIEF DESCRIPTION OF THE DRAWINGS

FIG. 5 is an exploded perspective view of an alternate form of tag assembly.

FIG. 6 is a perspective view showing the subject of FIG. 5 and a carrier in assembly.

FIG. 7 is a fragmentary section taken along line 7—7 in FIG. 6.

DETAILED DESCRIPTION OF THE INVENTION

Figure 1:
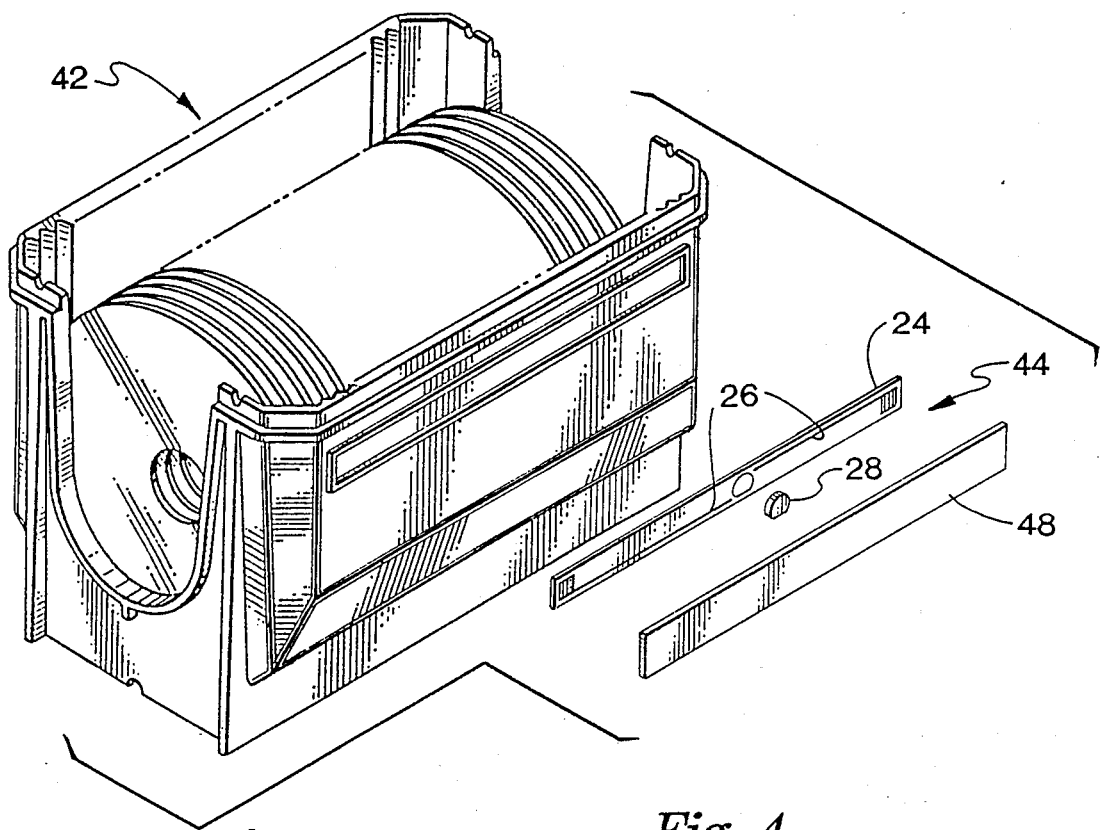
FIG. 1 is an exploded perspective view of a carrier of this invention.
Figure 4:
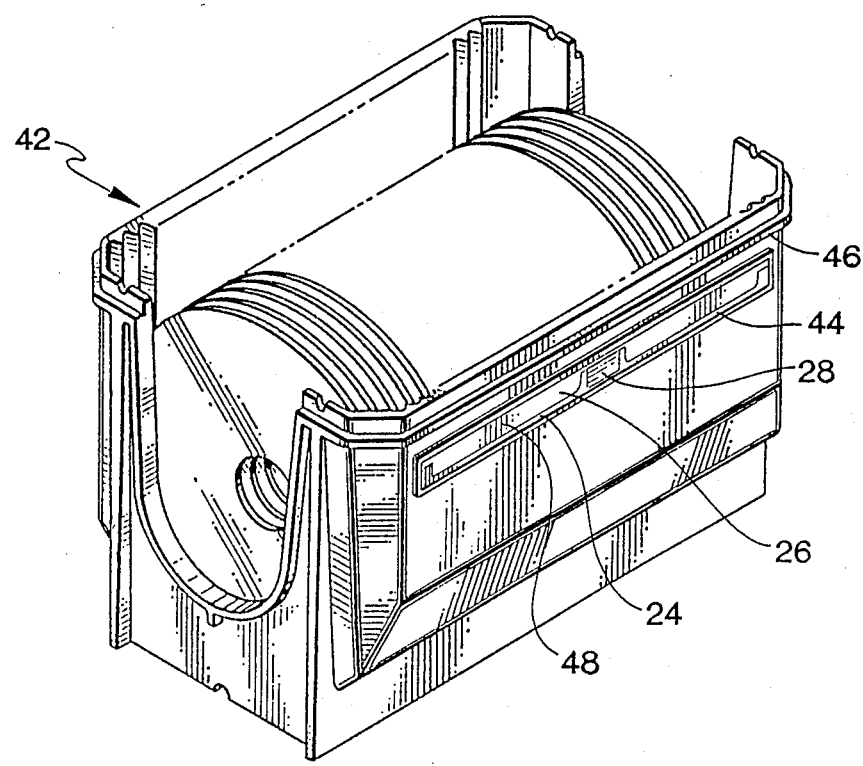
FIG. 4 is a pictorial drawing of the carrier of FIG. 1.

Typical wafer or disk carriers suitable for transporting and supporting a plurality of semiconductor wafers or memory disks in a parallel axially arranged and spaced array are shown in FIGS. 1, 4 and 6. Because the technology herein is equally suitable for semiconductor wafers or computer memory disks, the term "disk" is used hereinafter to designate either type of product, as well as any other generally similar product having a thickness which is substantially less than the width. Such carriers have been offered commercially for a number of years by Fluoroware, Inc., 102 Jonathan Boulevard North, Chaska, Minn. 55318 and are in widespread use in the semiconductor manufacturing industry. In the past, such carriers have been tracked through manufacturing operations by associating paper records with particular carriers and the batches of wafers or disks within.

Figure 8:
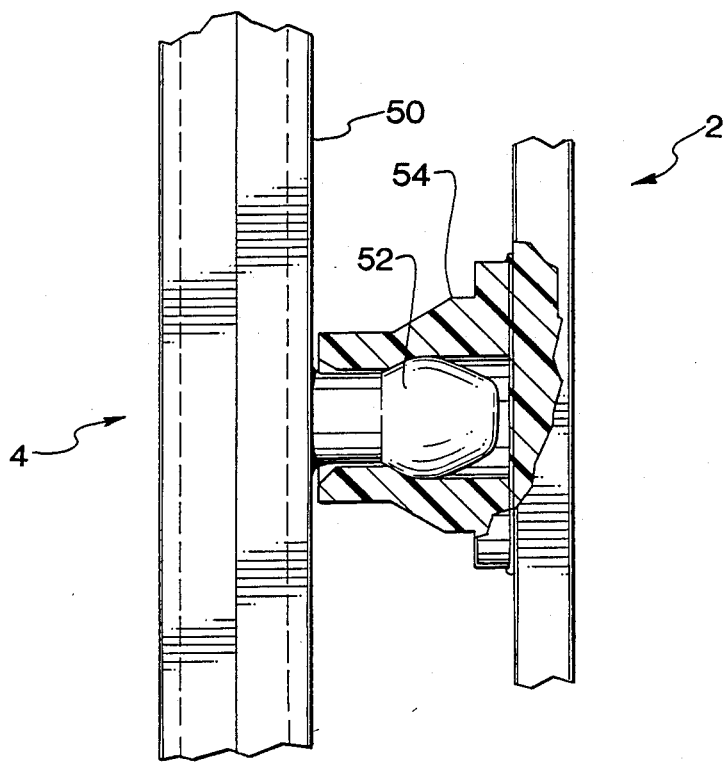
FIG. 8 is a fragmentary section showing another method of attaching the tag to a carrier.
Figure 9:
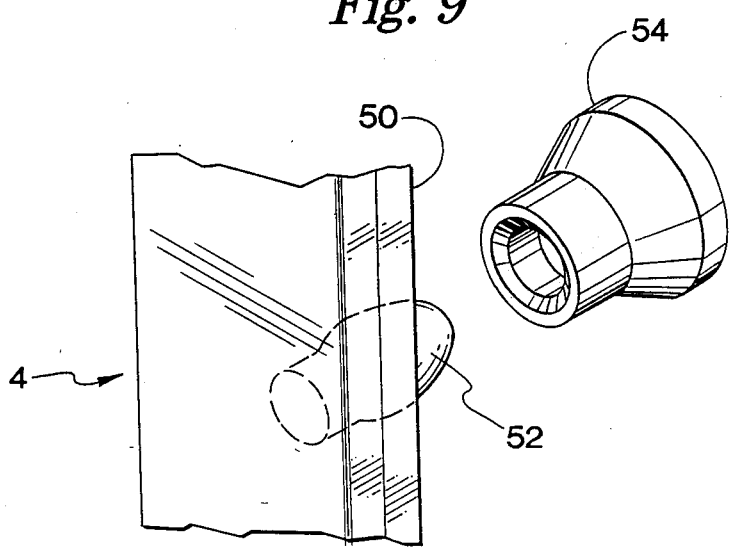
FIG. 9 is a perspective showing the method of attachment of FIG. 8.

Attached to the carrier 2 shown in FIG. 6 is an encapsulated tag 4, vertically attached to an end wall 6 thereof, parallel to the carrier side walls 8 and to the plane of the disks supported within the carrier 2. The two-part capsule 10 consists of a back 12 and cover 14, as shown in FIGS. 5 and 7. The interior of the back 12 and cover 14 are sized to closely accommodate the dimensions of the transponder tag 4. Minimizing interior space in the capsule further minimizes space for the processing fluids to come into contact with the transponder tag. Hermetic heat treatment seals the back 12 and cover 14 together around the transponder tag 4. As in FIG. 6, the exterior of the back 12 is provided with internally threaded bosses 18 for attaching the capsule 10 to the end wall 6 of the carrier 2 with plastic screws 20 through screw holes 22 drilled therein. Encapsulating the transponder tag 4 protects it from the rigorous chemical environments to which the carrier 2 and disks are subjected in normal processing operations. Removably attaching the encapsulated tag 4 permits the tag to be removed from the carrier 2 when the carrier.s useful life has expired from chemical exposure, so that the encapsulated tag may be reused on a new carrier. Placing the encapsulated tag 4 on an end wall 6 allows the carrier 2 to be used in the normal manner throughout the manufacturing process without interference. FIGS. 8 and 9 show a snap-fitting for attaching the transponder tag to a carrier. The exterior of the back 50 of the encapsulated tag 4 has molded therein or attached thereto one or more, usually two, bulbous spikes 52. The surface of the carrier 2, to which the transponder is to be attached, is provided with snap-fit receptacles 54 of the same number and spacing as the spikes 52. An existing carrier can be retrofitted or modified by having such receptacles 54 attached, as with fusion bonding, so that it may be used with the present location monitoring system. The receptacles 54, the tag 4 and the carrier 2 are generally all formed of the same or compatible materials.

Transponder tags generally suitable for use in obect monitoring systems are sold by XCI Corporation, 1710 Stierlin Road, Mountain View, California 94043. The transponder tag 4, in the embodiments shown in FIGS. 1, 5, 8 and 9, consists of two major components: a substrate 24 on which small antenna 26 is bonded and a synthetic lithium niobate crystal 28. Antenna 26 may be one or more printed circuit conductors mounted on a printed circuit substrate in a dipole or other suitable arrangement. The operation and structure of the RF transponder tag is further described in detail in our co-pending application Ser. No. 07/061,935, filed June 11, 1987, which is incorporated herein by reference.

FIGS. 1 and 4 show an alternate embodiment of a typical carrier 42 suitable for transporting and supporting a plurality of semiconductor wafers or memory disks in a parallel axially arranged and spaced array. Carrier 42 has a transponder tag 44 bonded to the surface of one of the walls thereof near the top 46 of the carrier. The transponder tag 44 may be protected with a cover 48 to isolate the tag from the deleterious chemical environments to which the carrier and disks are normally exposed in processing operations. The alternate carrier of FIGS. 1 and 4 is further completely described in our co-pending application Ser. No. 07/061,935, filed June 11, 1987, which is incorporated herein by reference.

It is to be understood that the precise location and method of affixing the transponder tag to a particular carrier will depend upon the manipulative procedures to which the carrier is subjected, positioning of the tag for best possible communication with the individual reader units and to avoid possible interference by the disks contained within the carrier. It is the association of the transponder tag with the individual carrier in a manner to protect the tag from deterioration by severe chemical environments, while allowing the tag to be clearly, accurately and consistently read by the various reader units, and enabling the carrier to be used without obstruction by standard processing equipment and procedures that is the inventive concept of the transponder tagged carrier of this invention. Thus, when the transponder tag is described herein as "attached" to the carrier, it is meant to include any method of attachment which will allow the transponder tag to be securely associated with a particular carrier so that it may be used in this manner.

Figure 2:
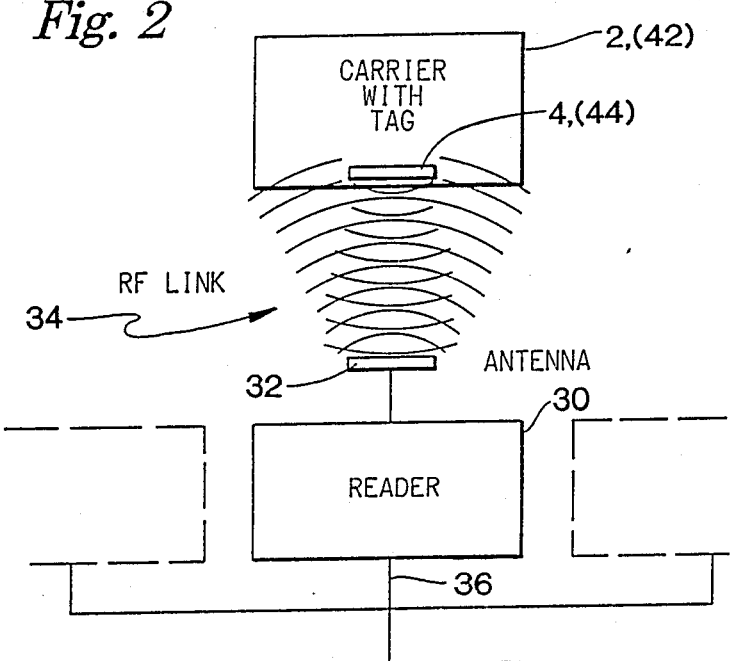
FIG. 2 is a block diagram or the monitoring system.

Turning now to FIG. 2, the system block diagram, the operation of the reader and transponder tag operation can be better understood. A single carrier 2, 42 is shown for the purposes of illustration but it will be realized that in the manufacturing facility a plurality of carriers, which may or may not be identical, will be utilized to transport and store numerous batches of disks undergoing processing. A remote recognition reader unit 30 drives an associated antenna 32 to propagate a radio frequency signal 34. Suitable readers are manufactured by XCI. The operation of the reader unit 30 to identify the transponder tag 4, 44 on the associated carrier 2, 42 and of the system represented by the block diagram of FIG. 2 is completely described in our copending application Ser. No. 07/061,935, filed June 11, 1987, which is incorporated herein by reference.

Figure 3:
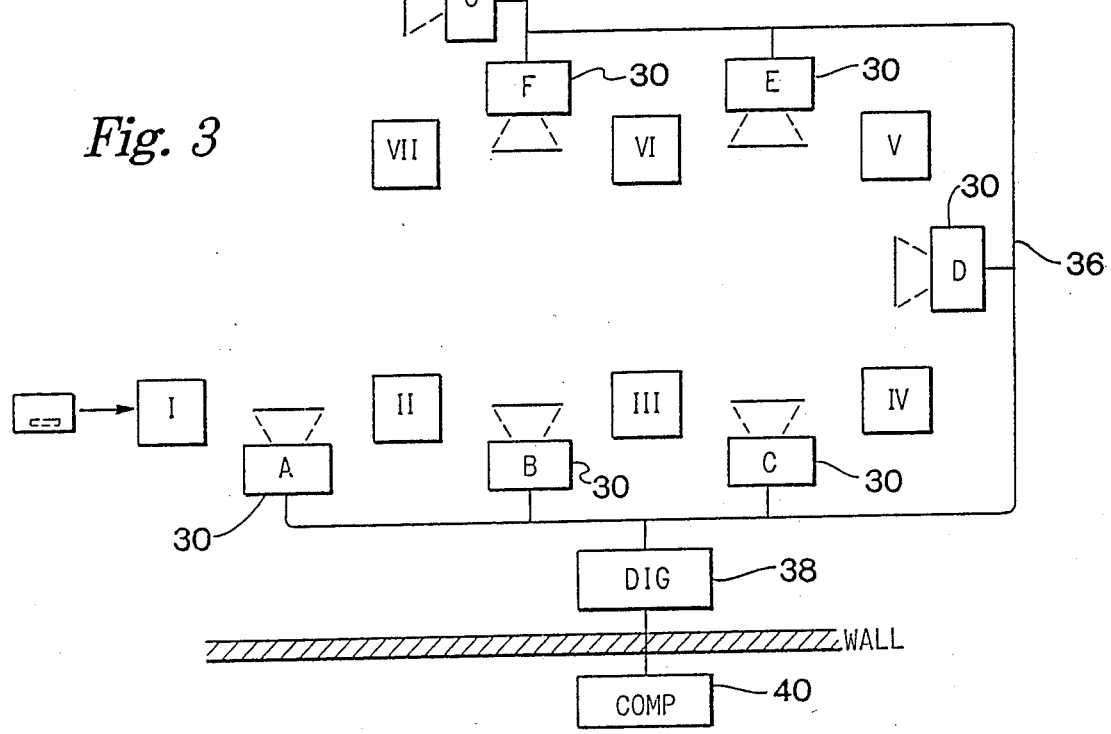
FIG. 3 is a schematic layout of a typical plant facility.

FIG. 3 illustrates a typical factory application where multiple remote readers 30 are each stationed at appropriate locations designated as stations I through VIII within the processing facility. One or more readers 30 may be positioned adjacent a particular station to monitor carriers as they are received or dispatched from the station or reach an intermediate location at a particular station. The outputs of the readers 30 A through H are connected to a transmission line 36 which links them via converter 38 with computer 40, which can be positioned at any convenient location inside or outside of the manufacturing facility. The operation of the typical factory application is completely described in our copending application Ser. No. 07/061,935, filed June 11, 1987, which is incorporated herein by reference.

It will be realized by those skilled in the art that various additions and modifications of the method and system disclosed herein and to the design and structure of the RF transponder tagged carrier may be made without departing from the essential features of novelty of the invention which are intended to be defined and secured by the appended claims.

What is claimed:

1. A method for monitoring the progress of a plurality of batches of disks through a multiplicity of operations atsseveral locations comprising the steps of:
    inserting each batch of disks into a carrier constructed and arranged for supporting the disks in a parallel, axially arranged spaced array;
    providing each carrier with a transponder tag constructed, arranged and coded for uniquely identifying the carrier and the batch inserted therein, said transponder tag encapsulated for protection from harsh chemical environments to which the disks and carrier are normally exposed and said transponder tag maintained encapsulated in precise relationship for correct identification by a reader unit constructed and arranged for determining the identification of any transponder tag within its detection range;
    detecting the presence of each carrier at one of the several locations by operating a multiplicity of limited range reader units, each of which is positioned adjacent to one of the locations; and
    monitoring the progress of at least one batch of disks through various locations by updating and storing location information received from the reader units.

2. A system for tracking batches of disks through a plurality of operations comprising:
    a plurality of carriers, each of which is adapted for carrying a batch of at least one disk;
    a plurality of transponder tags encapsulated for protection from harsh chemical environments to which the disks and carriers are normally exposed, each tag maintained encapsulated in precise relationship for correct identification by a remote recognition reader unit;
    said remote recognition reader unit constructed and arranged for transmitting an RF signal to the transponder tag and receiving a coded RF response therefrom indicative of the identity of a particular batch of disks and providing an output signal characteristic thereof; and
    control means for receiving the output from the reader units and providing a control signal indicative of which carrier is within the range of which reader.

3. The system of claim 2, wherein the transponder tag is attached to the outside surface of a vertical wall of a carrier, and the tag includes a transmitting antenna oriented perpendicular to the plane of the disks.

4. The system of claim 3, wherein the transponder tag includes a surface acoustic wave crystal adapted for modifying the phase of a received signal in accordance with a predetermined code and wherein the crystal is inductively coupled to the antenna.

5. The system of claim 4, wherein each of the reader units transmits a radio frequency signal to a transponder tag within its detection range and wherein the transponder tag receives the signal and returns a phase modulated signal coded to uniquely identify the transponder tag and the carrier to which it is attached.

6. The system of claim 2, wherein the transponder tgg is attached to the carrier by:
    encapsulating the tag in a capsule constructed and arranged to protect the tag from harsh chemical environments to which the disks and carriers are normally exposed;
    attaching the encapsulated tag to a surface of the carrier in precise relationship for correct identification by a remote recognition reader unit.

7. The system of claim 6, wherein the capsule is a two part capsule constructed and arranged to closely accommodate the tag, encapsulating is accomplished by sealing the two part capsule around the tag, and the encapsulated tag is removably attached to the surface of the carrier parallel to the plane of disks carried in the carrier.

8. The system of claim 2, wherein the transponder tag is comprised of:
    printed circuit antenna means mounted on a base; and
    a surface acoustic wave transducer mounted on the base, the transduce having at least one flat surface thereof mounted to the base with the antenna means operatively coupled to the transducer.

9. The system of claim 8, wherein the transducer includes transducer antenna means and wherein the antenna means is operatively coupled to the transducer antenna means by inductive coupling.

10. The system of claim 9, wherein the transducer is operatively coupled to the antenna by conductive connection.

11. The system of claim 2, wherein each of the reader units transmits a radio frequency signal to a transponder within its detection range which receives the signal and returns a phase modulated signal coded for uniquely identifying the transponder tag and the carrier to which it is attached.

12. A transponder tagged process carrier constructed and arranged for supporting a batch of at least one disk in a parallel, axially arranged spaced array and having attached thereto a transponder tag constructed, arranged and coded for uniquely identifying the carrier and the batch inserted therein.

13. A carrier according to claim 12 wherein the tag is protected from harsh chemical environments to which the disks and carrier are normally exposed.

14. A carrier according to claim 13, wherein said transponder tag is encapsulated in a capsule for protection from harsh chemical environments to which the disks and carrier are normally exposed.

15. A carrier according to claim 14, wherein the capsule is a two part capsule constructed and arranged to closely accommodate the tag, encapsulating is accomplished by sealing the two part capsule around the tag, and the encapsulated tag is removably attached to the surface of the carrier.

16. A carrier according to claim 15, wherein the carrier and the capsule are formed of PFA or polypropylene synthetic resin, sealing is hermetic heat sealing and removable attachment is threaded screw attachment or snap-fit attachment.

17. A carrier according to claim 14, wherein the encapsulated transponder tag is maintained in precise relationship for correct identification by a reader unit constructed and arranged for determining the identification of a transponder tag within its detection range.

18. A carrier according to claim 14, wherein the transponder tag includes a surface acoustic wave crystal adapted for modifying the phase of a received signal in accordance with a predetermined code and wherein the crystal is inductively coupled to the antenna.

19. A carrier according to claim 14, wherein the transponder tag is comprised of:
printed circuit antenna means mounted on a base; and
a surface acoustic wave transducer mounted on the base, the transducer having at least one flat surface thereof mounted to the base with the antenna means operatively coupled to the transducer.

20. A carrier according to claim 19, wherein the transducer includes transducer antenna means and wherein the antenna means is operatively coupled to the transducer antenna means by inductive coupling.

21. A carrier according to claim 20, wherein the transducer is operatively coupled to the antenna by conductive connection.

22. A carrier according to claim 13, wherein the transponder tag is mounted directly on a surface of the carrier.

23. A carrier according to claim 22, wherein the tag is mounted on a vertical wall of the carrier and includes a transmitting antenna oriented perpendicular to the plane of the disks.

24. A carrier according to claim 22, wherein the transponder tag includes a surface acoustic wave crystal adapted for modifying the phase of a received signal in accordance with a predetermined code and wherein the crystal is inductively coupled to the antenna.

25. A carrier according to claim 22, wherein the transponder tag is mounted on the carrier by:
inserting the transponder tag in a recess in a surface of the carrier, the recess being constructed and arranged for supporting the transponder tag perpendicular to the plane of disks carried in the carrier; and
sealing the transponder tag in the recess with a cover means constructed and arranged for covering and sealing the transponder tag from deleterious effects of harsh chemicals normally encountered by the carrier and disks in processing operations.

26. A carrier according to claim 22, wherein the transponder tag is comprised of:
printed circuit antenna means mounted on a base; and
a surface acoustic wave transducer having at least one flat surface thereof mounted mounted to the base with the antenna means operatively coupled to the transducer.

27. A carrier according to claim 26, wherein the transducer package includes transducer antenna means and wherein the antenna means is operatively coupled to the transducer antenna means by inductive coupling.

28. A carrier according to claim 27, wherein the transducer package is operatively coupled to the antenna by a conductive connection.

29. An encapsulated transponder tag, constructed and arranged to be attached to a process carrier, said carrier constructed and arranged for supporting a batch of at least one disk in a parallel, axially arranged spaced array, said tag arranged and coded for uniquely identifying the carrier and the batch inserted therein.

30. An encapsulated transponder tag according to claim 29, wherein the tag is encapsulated in a capsule for protection from harsh chemical environments to which the disks and carrier are normally exposed.

31. An encapsulated transponder tag according to claim 30, wherein the capsule is a two part capsule constructed and arranged to closely accomodate the tag and encapsulating is accomplished by sealing the two part capsule around the tag, and the encapsulated tag is constructed and arranged to be removably attached to a surface of a carrier.

32. An encapsulated transponder tag according to claim 31, wherein the capsule is formed of PFA or polypropylene synthetic resin, sealing is hermetic heat sealing, and removable attachment is threaded screw attachment or snap-fit attachment.

33. An encapsulated transponder tag according to claim 29, wherein the transponder includes a surface acoustic wave crystal adapted for modifying the phase of a received signal in accordance with a predetermined code and wherein the crystal is inductively coupled to the antenna.

34. An encapsulated transponder tag according to claim 29, wherein the transponder tag is comprised of:
printed circuit antenna means mounted on a base; and
a surface acoustic wave transducer mounted on the base, the transponder having at least one flat surface thereof mounted to the base with the antenna means operatively coupled to the transducer.

35. An encapsulated transponder tag according to claim 34, wherein the transducer includes transducer antenna means and wherein the antenna means is operatively coupled to the transducer antenna means by inductive coupling.

36. An encapsulated transponder tag according to claim 35, wherein the transducer is operatively coupled to the antenna by conductive connection.

* * * * *

UNITED STATES PATENT AND TRADEMARK OFFICE
CERTIFICATE OF CORRECTION

PATENT NO. : 4,888,473

DATED : December 19, 1989

INVENTOR(S) : Alexander N. Rossi, et al.

It is certified that error appears in the above-identified patent and that said Letters Patent is hereby corrected as shown below:

In column 5, line 29, "atsseveral locations" should read "at several locations".

Signed and Sealed this

Fourth Day of June, 1991

Attest:

HARRY F. MANBECK, JR.

Attesting Officer

Commissioner of Patents and Trademarks

REEXAMINATION CERTIFICATE (3024th)
United States Patent [19]
Rossi et al.

[11] B1 4,888,473
[45] Certificate Issued * Oct. 15, 1996

[54] WAFER DISK LOCATION MONITORING SYSTEM AND TAGGED PROCESS CARRIER FOR USE THEREWITH

[75] Inventors: Alexander N. Rossi, Pleasanton; Mario N. Sancen, Antioch, both of Calif.

[73] Assignee: Fluoroware, Inc., Chaska, Minn.

Reexamination Request:
No. 90/003,942, Aug. 14, 1995

Reexamination Certificate for:
Patent No.: 4,888,473
Issued: Dec. 19, 1989
Appl. No.: 346,915
Filed: May 3, 1989

[*] Notice: The portion of the term of this patent subsequent to Jun. 11, 2007, has been disclaimed.

Certificate of Correction issued Jun. 4, 1991.

Related U.S. Application Data

[63] Continuation-in-part of Ser. No. 61,935, Jun. 11, 1987, Pat. No. 4,827,110.

[51] Int. Cl.[6] .................................................. G06F 15/46
[52] U.S. Cl. ........................................ 235/376; 235/380
[58] Field of Search .................................. 235/375, 376, 235/460

[56] References Cited

U.S. PATENT DOCUMENTS

| | | | |
|---|---|---|---|
| 4,242,663 | 12/1980 | Slobodin | 340/152 T |
| 4,570,058 | 2/1986 | Havassy | 235/479 |
| 4,670,295 | 6/1987 | Quinn et al. | 427/54.1 |
| 4,794,238 | 12/1988 | Hampton | 235/462 |
| 4,799,059 | 1/1989 | Grindahl et al. | 340/870.03 |
| 4,807,140 | 2/1989 | Saulnier | 364/468 |
| 4,825,093 | 4/1989 | Kiriscko et al. | 250/566 |
| 4,827,110 | 5/1989 | Rossi et al. | 235/376 |
| 4,833,306 | 5/1989 | Milbrett | 235/375 |
| 4,870,419 | 9/1989 | Baldwin et al. | 342/50 |
| 4,888,474 | 12/1989 | Walton et al. | 235/449 |
| 4,888,591 | 12/1989 | Landt et al. | 342/44 |
| 4,889,158 | 2/1990 | Saeki et al. | 342/44 |
| 4,944,650 | 7/1990 | Matsumoto | 414/757 |
| 4,955,780 | 9/1990 | Shimane et al. | 414/744 |
| 4,983,815 | 1/1991 | Kumsaka | 235/376 |
| 5,015,832 | 5/1991 | Filipski | 235/462 |

FOREIGN PATENT DOCUMENTS

| | | |
|---|---|---|
| 0448507A2 | 9/1991 | European Pat. Off. . |
| 2607608A | 6/1988 | France . |
| 62-266688A | 11/1987 | Japan . |
| 63-273979A | 11/1988 | Japan . |
| 1-82194A | 3/1989 | Japan . |

*Primary Examiner*—Harold Pitts

[57] ABSTRACT

A method and system for monitoring the process of a plurality of batches or semiconductor wafers or memory disks through a series of process operations and process carriers for use therein. Each batch is placed in a carrier in which it is transported to the locations where the processing operations are performed. Each carrier is provided with a transponder tag coded to be responsive to within reading range of a reader unit which transmits a radio frequency signal to the transponder tag and reads and decodes a phase modulated signal returned by the transponder tag to uniquely identify the carrier that is positioned within the range of the reader unit. Further control apparatus receives information from the reader units to permit the monitoring process of semiconductor wafer or memory disk batches through multiple processing operations. The carriers are specially designed to protect the transponder tag from the effects of the harsh chemical environments to which the carriers and disks are normally exposed during processing operations. A separate encapsulated transponder tag is also provided for attachment to existing carriers, so that they may be tracked by this monitoring system.

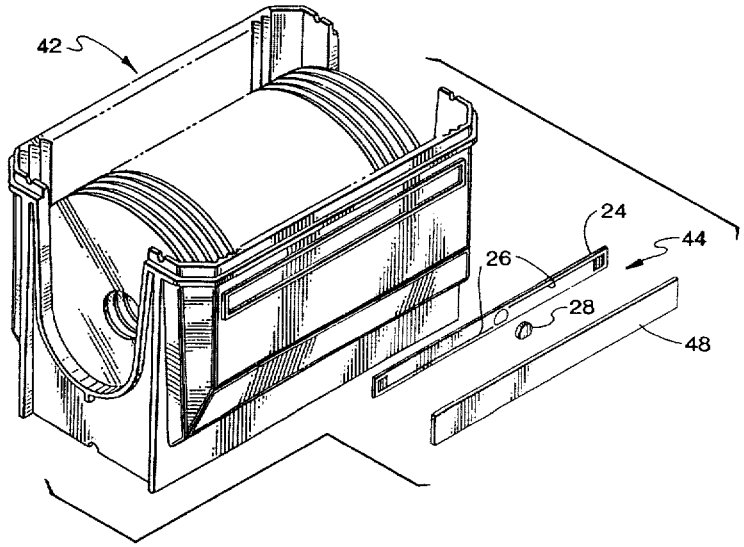

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–36 is confirmed.

* * * * *